(12) United States Patent
Seeger et al.

(10) Patent No.: US 9,606,191 B2
(45) Date of Patent: Mar. 28, 2017

(54) MAGNETOMETER USING MAGNETIC MATERIALS ON ACCELEROMETER

(71) Applicant: Invensense, Inc., San Jose, CA (US)

(72) Inventors: Joseph Seeger, Menlo Park, CA (US); Jin Qiu, Sunnyvale, CA (US); Matthew Julian Thompson, Beaverton, OR (US)

(73) Assignee: INVENSENSE, INC., San Jose, CA (US)

( * ) Notice: Subject to any disclaimer, the term of this patent is extended or adjusted under 35 U.S.C. 154(b) by 54 days.

(21) Appl. No.: 14/208,222

(22) Filed: Mar. 13, 2014

(65) Prior Publication Data

US 2014/0266170 A1 Sep. 18, 2014

Related U.S. Application Data

(60) Provisional application No. 61/794,009, filed on Mar. 15, 2013.

(51) Int. Cl.
| | |
|---|---|
| *G01N 27/72* | (2006.01) |
| *G01R 33/02* | (2006.01) |
| *G01P 15/08* | (2006.01) |
| *G01R 33/028* | (2006.01) |
| *H01L 21/00* | (2006.01) |

(52) U.S. Cl.
CPC .............. *G01R 33/02* (2013.01); *G01P 15/08* (2013.01); *G01R 33/0286* (2013.01); *B81B 2201/00* (2013.01); *H01L 21/00* (2013.01); *H01L 2221/00* (2013.01)

(58) Field of Classification Search
CPC ........ H01L 21/00; H01L 2221/00; G01P 1/00; B81B 1/00; B81B 2201/00
See application file for complete search history.

(56) References Cited

U.S. PATENT DOCUMENTS

| | | | |
|---|---|---|---|
| 4,951,510 A | 8/1990 | Holm-Kennedy | |
| 8,205,497 B1 | 6/2012 | Okandan et al. | |
| 8,973,439 B1* | 3/2015 | Baldasarre | G01P 15/125 73/504.12 |
| 2003/0010123 A1* | 1/2003 | Malvern | G01P 15/0802 73/514.32 |
| 2004/0158439 A1 | 8/2004 | Kim | |
| 2005/0241394 A1* | 11/2005 | Clark | B81B 5/00 73/504.12 |
| 2008/0053228 A1* | 3/2008 | Pan | G01P 15/0802 73/514.01 |
| 2009/0139330 A1* | 6/2009 | Pavelescu | G01D 21/02 73/514.32 |
| 2010/0095770 A1 | 4/2010 | Hsu | |

(Continued)

*Primary Examiner* — Huy Q Phan
*Assistant Examiner* — Temilade Rhodes-Vivour
(74) *Attorney, Agent, or Firm* — Maryam Imam; IPxLaw Group LLP

(57) ABSTRACT

A MEMS device including a first proof mass, a first magnetized magnetic material disposed partially on a surface of the first proof mass, a first spring anchored to a substrate to support the first proof mass, and a first sensing element coupled to the first proof mass and operable to sense the motion of the first proof mass caused by an ambient acceleration. The MEMS device further includes a second sensing element coupled to the first proof mass and operable to sense the motion of the first proof mass caused by an ambient magnetic field.

51 Claims, 10 Drawing Sheets

(56) References Cited

U.S. PATENT DOCUMENTS

| | | | |
|---|---|---|---|
| 2010/0242603 A1* | 9/2010 | Miller | B81B 7/02 |
| | | | 73/514.32 |
| 2012/0176129 A1 | 7/2012 | Seeger et al. | |
| 2014/0062619 A1* | 3/2014 | Montanya Silvestre | B81C 1/00246 |
| | | | 333/186 |
| 2014/0076051 A1* | 3/2014 | Ma | G01P 15/097 |
| | | | 73/514.29 |
| 2014/0208823 A1* | 7/2014 | Trusov | G01P 21/00 |
| | | | 73/1.38 |

* cited by examiner

MAGNETOMETER USING MAGNETIC MATERIALS ON ACCELEROMETER

CROSS REFERENCE TO RELATED APPLICATIONS

This application claims priority to U.S. Provisional Application No. 61/794,009 filed on Mar. 15, 2013, entitled "Magnetometer Using Magnetic Material on Accelerometer", by Seeger et al., the disclosure of which is incorporated herein by reference as though set forth in full.

BACKGROUND

Various embodiment of the invention relate generally to a MEMS device with a proof mass and particularly to a MEMS device operable to measure ambient acceleration and ambient magnetic field by detection motion caused on the proof mass.

MEMS devices typically include sensors for measuring the motion of a proof mass, such as proof mass motion caused by an ambient acceleration and proof mass motion caused by an ambient magnetic field. Currently, a magnetometer, used for measuring the magnetic field is a device separate and apart from an accelerometer used for measuring ambient acceleration. However, due to fabrication imperfections or by design a magnetic field sensor can have a response to an ambient acceleration. A single MEMS device is proposed to measure both ambient acceleration and ambient magnetic field. This results in a smaller MEMS device by decreasing the MEMS footprint and therefore cost.

It is obviously desirable to reduce the size of the sensors and/or the number of required semiconductors in an effort to reduce cost and size.

Accordingly, there is a need for a small MEMS device with decreased costs and increased performance.

SUMMARY

Briefly, an embodiment of the invention includes a MEMS device having at least one proof mass. A first magnetized magnetic material disposed partially on a surface of the at least one proof mass. A first spring anchored to a substrate to support the at least one proof mass. A first sensing element responsive to both ambient magnetic and ambient acceleration and a second sensing element coupled to the at least one proof mass. The at least one proof mass moves in response to ambient acceleration and ambient magnetic field. A configuration of the first and second sensing element comprising a signal processor, the signal processor operable to provide a first output responsive to ambient magnetic field.

A further understanding of the nature and the advantages of particular embodiments disclosed herein may be realized by reference of the remaining portions of the specification and the attached drawings.

DETAILED DESCRIPTION OF EMBODIMENTS

The following description describes a MEMS device. The MEMS device has a proof mass and two sensing elements used to measure an ambient acceleration and an ambient magnetic field, as discussed below Particular embodiments and methods of the invention disclose a MEMS device including a first proof mass, a first magnetized magnetic material disposed partially on a surface of the first proof mass, a first spring anchored to a substrate to support the first proof mass, and a first sensing element coupled to the first proof mass and operable to sense the motion of the first proof mass caused by an ambient acceleration. The MEMS device further includes a second sensing element coupled to the first proof mass and operable to sense the motion of the first proof mass caused by an ambient magnetic field. In the described embodiments, ambient magnetic field refers to any magnetic field other than the magnetic field created from the deposited magnetic material on the proof mass.

Figure 1:
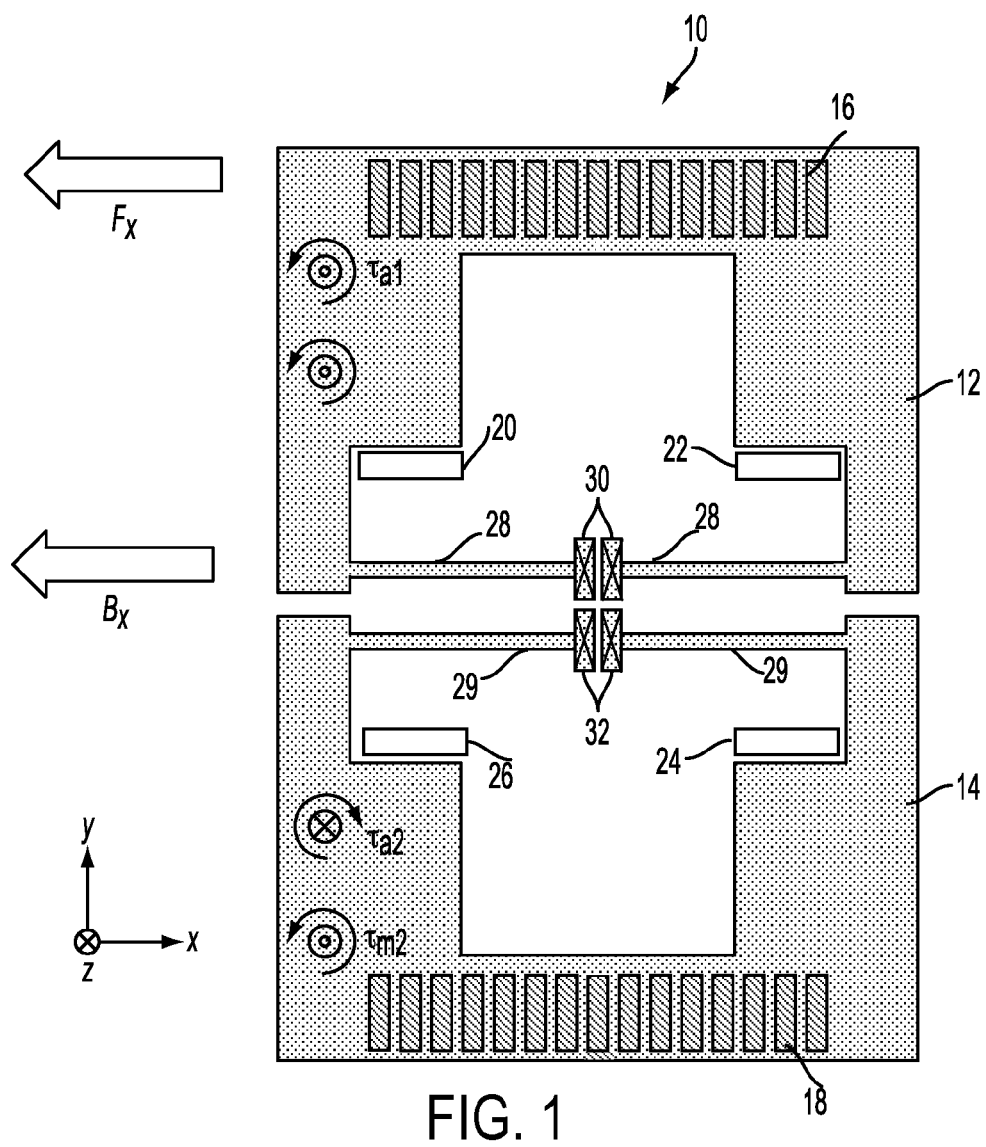
FIG. 1 shows a MEMS device, in accordance with an embodiment of the invention.

Referring now to FIG. 1, a MEMS device 10 is shown, in accordance with an embodiment of the invention. In the embodiment of FIG. 1, the MEMS device 10 is an x-axis accelerometer as well as an x-axis magnetometer although it is understood that the MEMS device 10 may be a y-axis or z-axis accelerometer and magnetometer. The MEMS device 10 is shown to include a proof mass 12, a proof mass 14, a magnetized magnetic material 16 and 18, sensing elements 20-26, a pair of springs 28 and 29, and anchors 30 and 32. The structures shown in FIG. 1 are formed on a substrate of the MEMS device. The two proof masses 12 and 14 are mirror images of each other in the embodiment of FIG. 1.

The proof mass 12 has a magnetized magnetic material 16 disposed on at least a part of the surface thereof, similarly, the proof mass 14 has a magnetized magnetic material 18 disposed on at least a part of the surface thereof. The sensing elements 20 and 22 are shown coupled to the proof mass 12 and the sensing elements 24 and 26 are shown coupled to the proof mass 14. The springs 28 and 29 are connected to anchors 30 and 32 and the anchors are fixed to the substrate, which lies under the structures shown in FIG. 1. For each of the proof masses 12 and 14, the spring is suspended from the anchor and the proof mass is suspended from the spring.

In the embodiment of FIG. 1, the magnetic material 16 is magnetized along the positive y-axis direction, similarly, the magnetic material 18 is magnetized along the positive y-axis direction. It is contemplated that in other embodiments, the magnetic materials 16 and 18 may be magnetized in a different direction.

In some embodiments of the invention, each of the magnetized magnetic materials 16 and 18 is not necessarily a solid piece and is rather made of smaller pieces, as shown in FIG. 1. In some embodiments, magnetic material 16 and 18 is constructed from a single continuous piece.

In some embodiments of the invention, each of the magnetic materials 16 and 18 is made of or any combination of cobalt (Co), iron (Fe), and nickel (Ni).

In an embodiment of the invention, each of the sensing elements 20-26 is a variable capacitor. In another embodiment of the invention, each of the sensing elements 20-26 is a pieizoresistor sensing element, a piezoelectrical sensing element or an optical sensing element. In the embodiments and discussions to follow, the sensing elements 20-26 are assumed to be capacitors. It is understood that the same discussions and embodiments apply to embodiments with sensing elements 20-26 that are not capacitors.

Under ambient positive x-axis acceleration a counter-clockwise torque $\tau_{a1}$ is imposed on the proof mass 12. The proof mass 12 rotates counter-clockwise and sensing element 20 increases and the sensing element 22 decreases.

Under ambient positive x-axis acceleration a clockwise torque $\tau_{a2}$ is imposed on proof mass 14. Proof mass 14 rotates clockwise and sensing element 24 increases and the sensing element 26 decreases. Alternatively, one of the proof masses 12 or 14 may be employed with two sensing elements to measure the acceleration and magnetic field independently on one proof mass.

In measuring an ambient magnetic field, an ambient magnetic field $B_y$ is applied to the MEMS device 10, of FIG. 1, in the negative x-axis direction (to the left), causing a torque $\tau_m = V M_y \times B_x$ to be applied to the proof masses 12 and 14. "$\tau_m$" represents the torque, "V" represents the volume of magnetic material 16 and 18, "$M_x$" is the material's remnant magnetization, "$B_y$" is the applied field along the y-axis, and "x" represents the vector cross product. The motion of the proof masses 12 and 14 due to these torques is detected by sensing elements 20-26, but their response is different than that of acceleration. Under an ambient magnetic field a counter-clockwise torque $\tau_{m1}$ is imparted on proof mass 12. Proof mass 12 rotates counter-clockwise and sensing element 20 increases and sensing element 22 decreases. Under an ambient magnetic field a counter-clockwise torque $\tau_{m2}$ is imparted on proof mass 14. Proof mass 14 rotates counter-clockwise and sensing element 24 increases and sensing element 26 decreases. The circuit configuration of the sensing elements 20-26 for detecting the magnetic field of the proof masses 12 and 14 is changed from that which is shown in FIG. 2(a), measuring acceleration, to that shown in FIG. 2(b), measuring magnetic field.

Figure 2A:
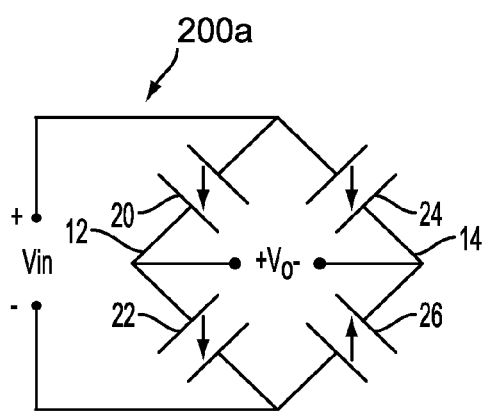
FIGS. 2(a) and 2(b) show a couple of circuit configurations of the sensing elements in measuring acceleration and magnetic field.
Figure 2B:
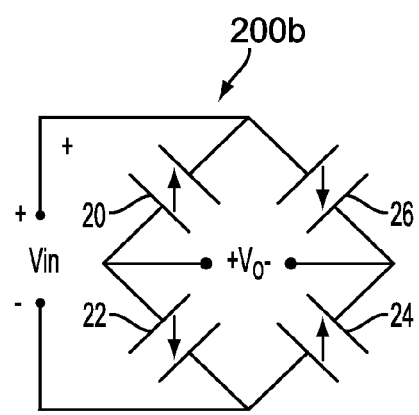

Sensing is now discussed relative to FIGS. 1, 2(a), and 2(b).

FIGS. 2(a) and 2(b) show a couple of circuit configurations of the sensing elements 20-26 for measuring external acceleration and external magnetic field where the sensing elements are variable capacitors like parallel plate electrodes or linear comb fingers. FIG. 2(a) shows the circuit configuration 200a of these sensing elements when the MEMS device 10 is measuring accelerometer of the proof masses 12 and 14 and FIG. 2(b) shows the circuit configuration 200b of these sensing elements when the MEMS device 10 is measuring magnetic field of the proof masses 12 and 14. The sensing elements 20-26 are configured in the form of a Wheatstone bridge in each of the FIGS. 2(a) and 2(b).

In an embodiment of the invention, for sensing external x-axis acceleration, the sensing elements 20-26 are connected in a Wheatstone bridge configuration as shown in FIG. 2(a). As shown in FIG. 2(a), a voltage difference $V_{in}$ is applied across the two proof masses 12 and 14 and the output voltage is $V_0$. The output voltage $V_0$ changes due to the change in the capacitances of the sensing elements 20-26 caused by the motion of the proof masses 12 and 14 caused by the external acceleration.

In an embodiment of the invention, for sensing external x-axis magnetic field, the sensing elements 20-26 are connected in a Wheatstone bridge configuration as shown in FIG. 2(b). As shown in FIG. 2(b), a voltage difference $V_{in}$ is applied across the two proof masses 12 and 14 and the output voltage is $V_0$. The output voltage $V_0$ changes due to the change in the capacitances of the sensing elements 20-26 caused by the motion of the proof masses 12 and 14 caused by the external magnetic field.

In an embodiment of the invention, $V_{in}$ can be a combination of alternating current, DC or a combination of AC and DC. In an alternate embodiment, the terminals marked $V_0$ can be connected to a differential transcapacitance amplifier. In this embodiment the output of the amplifier is proportional to the capacitance change of the sensing elements 20-26. In yet another embodiment, the driving voltage, $V_o$, can be applied to sensing elements 20-26 and the output signal can be detected from the proof mass nodes marked $V_{in}$, in FIG. 2(a). In this embodiment, an output voltage can be measured directly from the proof mass 12 and/or 14.

In an embodiment of the invention, a switch may be used to switch between the configurations of FIGS. 2(a) and 2(b) of the sensing elements 20-26. In this manner, the MEMS device 10 of FIG. 1, when connected to an amplifier, can be used to detect acceleration and magnetic field depending on the switch setting. Further discussion of the switches follows below relative to FIGS. 3(a) and 3(b). Alternatively, the switch and therefore the configuration of the sensing elements 20-26 can be controlled to periodically switch between acceleration sensing and magnetic field sensing therefore providing both sensing signals.

By rotating the MEMS device 10, of FIG. 1, 90 degrees, y-axis acceleration and y-axis magnetic field can be detected.

Figure 3A:
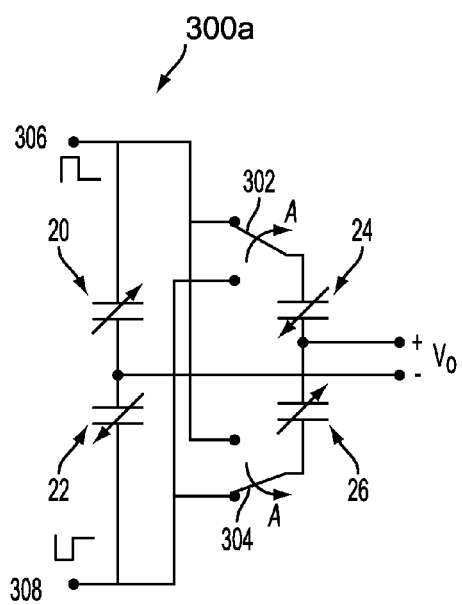
FIGS. 3(a) and 3(b) show circuit configurations including switches that cause the different configurations.
Figure 3B:
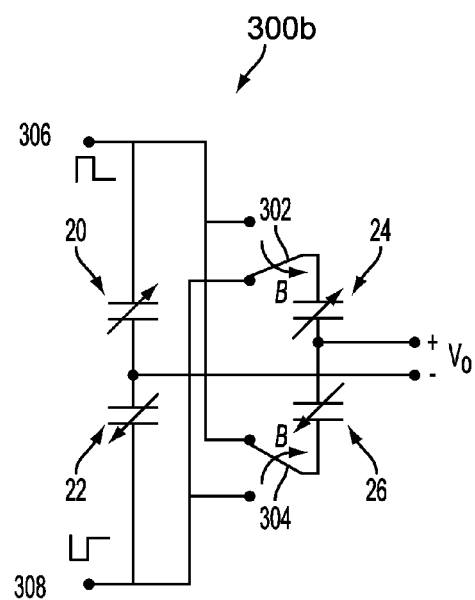

Circuit 300a shown in FIG. 3(a) and circuit 300b shown in FIG. 3(b) is configurations of circuit 200a of FIG. 2(a) and circuit 200b of FIG. 2(b) including switches that select different configurations of sensing elements 20-26. These figures show the switches 302 and 304 changing the configuration of the sensing elements 20-26 from sensing external acceleration, in FIG. 3(a), to sensing external magnetic field, in FIG. 3(b).

In FIG. 3(a), the setting of the switch 302, in position A, causes coupling of the sensing elements 20 and 24 and the setting of the switch 304, also in position A, causes coupling of the sensing elements 26 and 22. Positive pulses are applied at 306 driving sensing elements 20 and 24, while negative pulses are applied at 308 driving sensing elements 22 and 26. Whereas, in FIG. 3(b), the setting of the switch 302, in position B, causes coupling of the sensing elements 22 and 24 and the setting of the switch 304, also in position B, causes coupling of the sensing elements 20 and 26. The positive pulses are now applied at 306 driving sensing elements 20 and 26, while the negative pulses are applied at 308 driving sensing elements 22 and 24. The switches 302 and 304 are formed on the same chip as the MEMS device 10.

Figure 4:
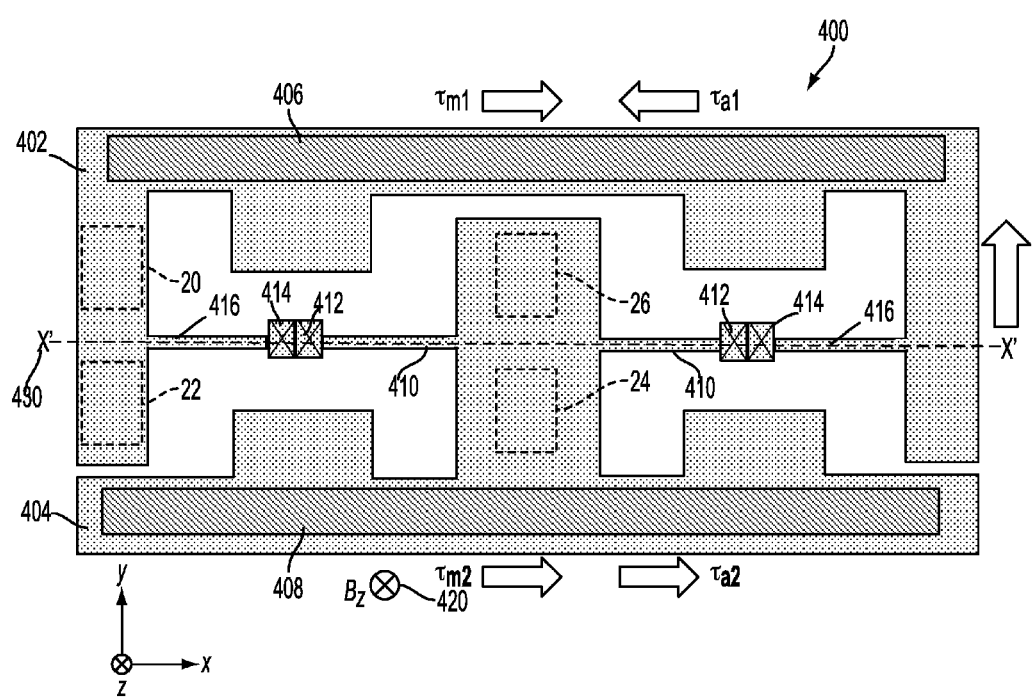
FIG. 4 shows a MEMS device, in accordance with another embodiment of the invention.

FIG. 4 shows a MEMS device 400, in accordance with another embodiment of the invention. The MEMS device 400 is a z-axis accelerometer, which can also be used as a z-axis magnetometer. In FIG. 4, the proof masses 402 and 404 are shown to have magnetized magnetic materials 406 and 408, respectively, disposed on a part of a surface of a respective proof mass. The magnetized magnetic materials 406 and 408 are each magnetized along the +y direction. Proof mass 402 is connected to the anchors 414 with the pair of springs 416 and proof mass 404 is connected to anchors 412 with the pair of springs 410. The proof masses are suspended from the substrate through the springs and the anchors.

As with the embodiment of FIG. 1, the four sensing elements 20-26 are positioned under the proof masses 402 and 404 with the two sensing elements 20 and 22 disposed under the proof mass 402 and the two sensing elements 24 and 26 disposed under the proof mass 404. In this respect, the pair of springs 410 supports the proof mass 402 and the pair of springs 416 supports the proof mass 404. As shown in FIG. 4, each of the proof masses 402 and 404 has mass asymmetry about axis 430.

Under an external +z acceleration proof mass 402 will experience a negative RX torque $\tau_{a1}$ causing proof mass 402 to rotate about axis 430 in the negative RX direction. Under an external +z acceleration proof mass 404 will experience a positive RX torque $\tau_{a1}$ causing proof mass 404 to rotate about axis 430 in the positive RX direction. The motions due to the negative RX torque $\tau_{a1}$ and positive RX torque $\tau_{a1}$ are detected by sense elements 20-26 under the proof masses 402 and 404 using the circuit configuration in FIG. 2(a).

Under an external negative z-axis magnetic field ($B_z$) the magnetic material 406 of MEMS device 400, interacts causing a torque $\tau_{m1} = V\ M_y \times B_z$ on proof mass 402 causing the proof mass 402 to rotate about axis 430 in the positive RX direction. Under an external negative z-axis magnetic field ($B_z$) the magnetic material 408, of MEMS device 400, interacts causing a torque time $\tau_{m2} = V\ M_y \times B_z$ on proof mass 404 causing the proof mass 404 to rotate about axis 430 in the positive RX direction. The motions due to the magnetic torques ($\tau_{m1}$ and $\tau_{m2}$) are detected by sense elements 20-26 under the proof masses 402 and 404 using the circuit configuration in FIG. 2(b).

Figure 5:
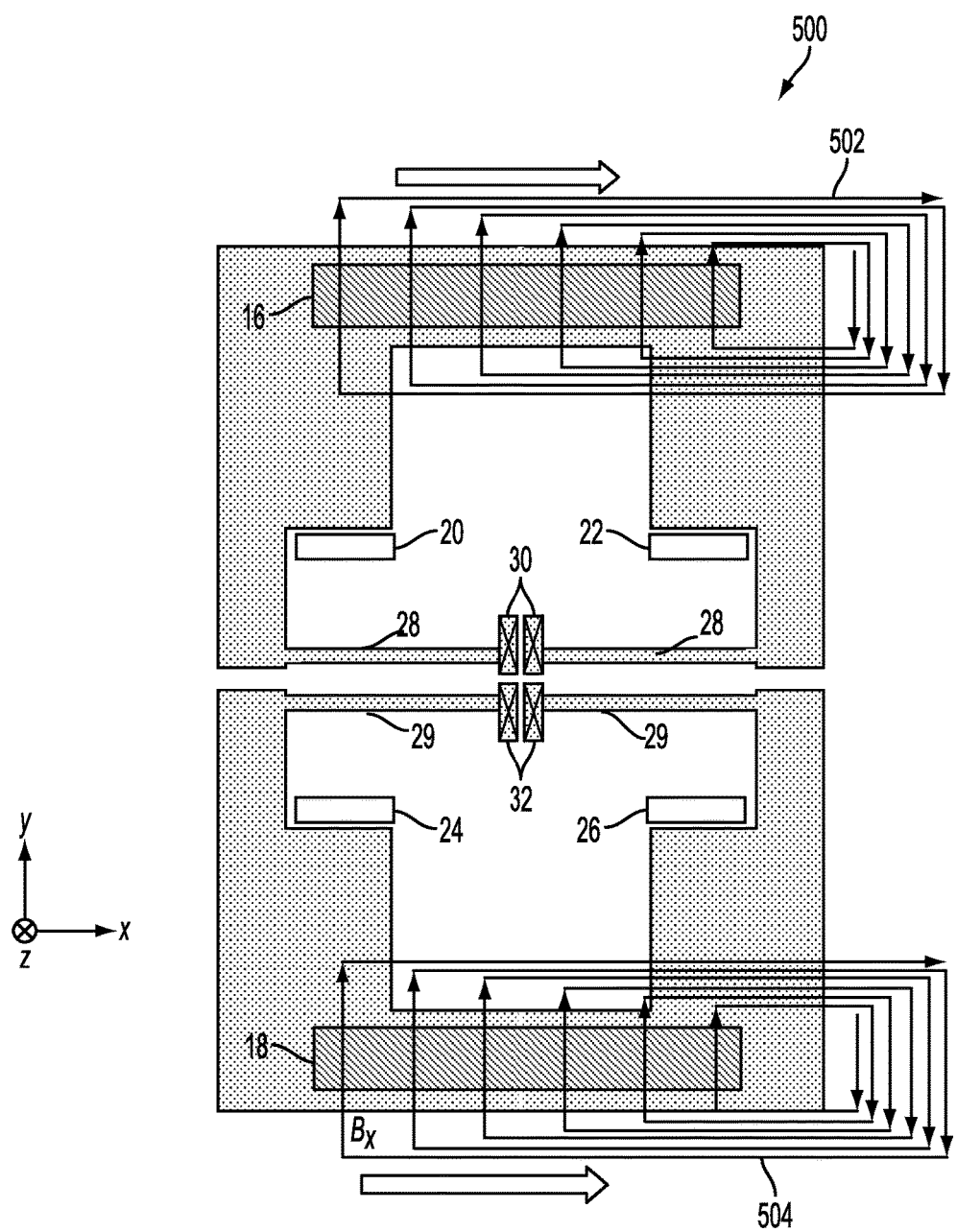
FIG. 5 shows a MEMS device, in accordance with another embodiment of the invention.

FIG. 5 shows a MEMS device 500, in accordance with another embodiment of the invention. The MEMS device 500 of FIG. 5 is analogous to the MEMS device 10 of FIG. 1 with the addition of a pair of magnetic field generating self-test coils 502 and 504. The magnetic self-test coil 502 is constructed under the magnetized magnetic material 16 and the magnetic self-test coil 606 is shown under the magnetized magnetic material 18. Each of the coils 502 and 504 is a coil of conductive wire. When current flows through the metal wire, i.e. coils 502 or 504, as shown by the arrows in FIG. 5, a negative x-axis magnetic field is generated at location of the magnetized magnetic material 16 and 18. The magnetized magnetic materials 16 and 18 are used during self-test of the MEMS device 500.

Magnetic self-test is useful both during manufacture and use. For z-axis magnetometers, flowing current can be used to generate a z-directed magnetic field.

Figure 6:
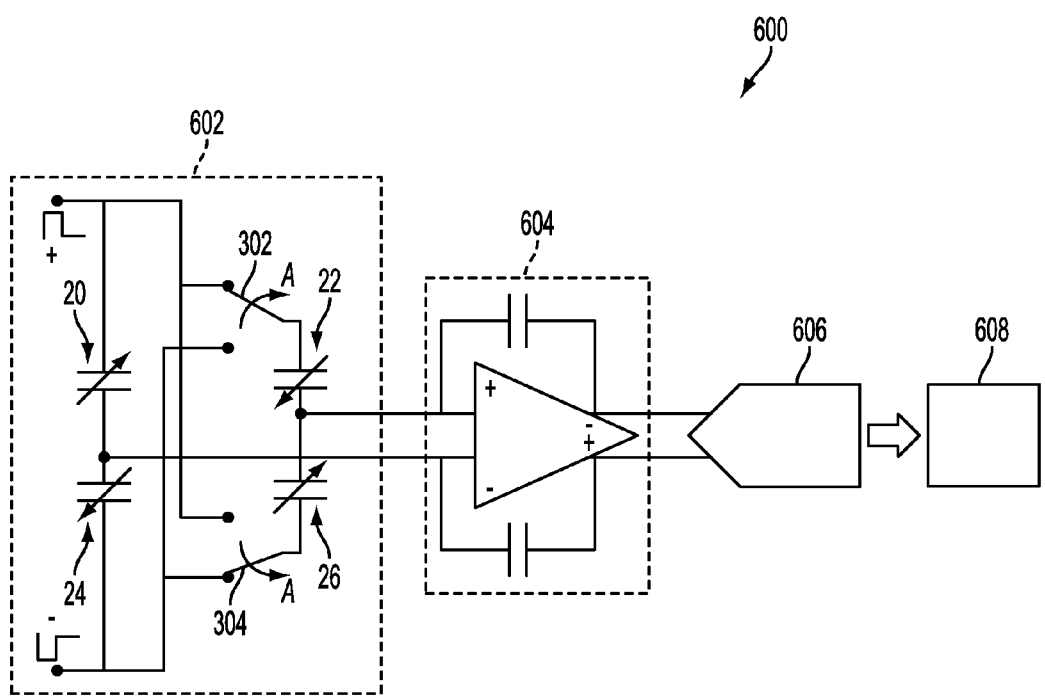
FIG. 6 shows a sensing circuit, in accordance with an embodiment of the invention.

FIG. 6 shows a sensing circuit 600, in accordance with an embodiment of the invention. The circuit 600 is shown to include a capacitor bridge 602, a capacitance-to-voltage amplifier 604, an analog-to-digital converter (ADC), and a digital electronics 608. The bridge 602 is shown coupled to the amplifier 604, which is shown coupled to the ADC 606, which is shown to provide output to the digital electronics 608.

The bridge 602 is analogous to the circuit configuration with switches of FIG. 3(a).

In operation, out-of-phase voltage pulses are provided as input to the bridge 602 at 306 and 308. The output of bridge 602, analogous to circuit 300a and 300b, is converted to voltage by the amplifier 604 and the output of the amplifier 604 is converted from analog form to digital form. The resulting digital signal, i.e. the digital output by the ADC 606, is processed by digital electronics 608 to produce values for both acceleration and magnetic field.

In an alternative embodiment of the invention, the amplifier 604 is a differential trans-capacitance amplifier.

Figure 7:
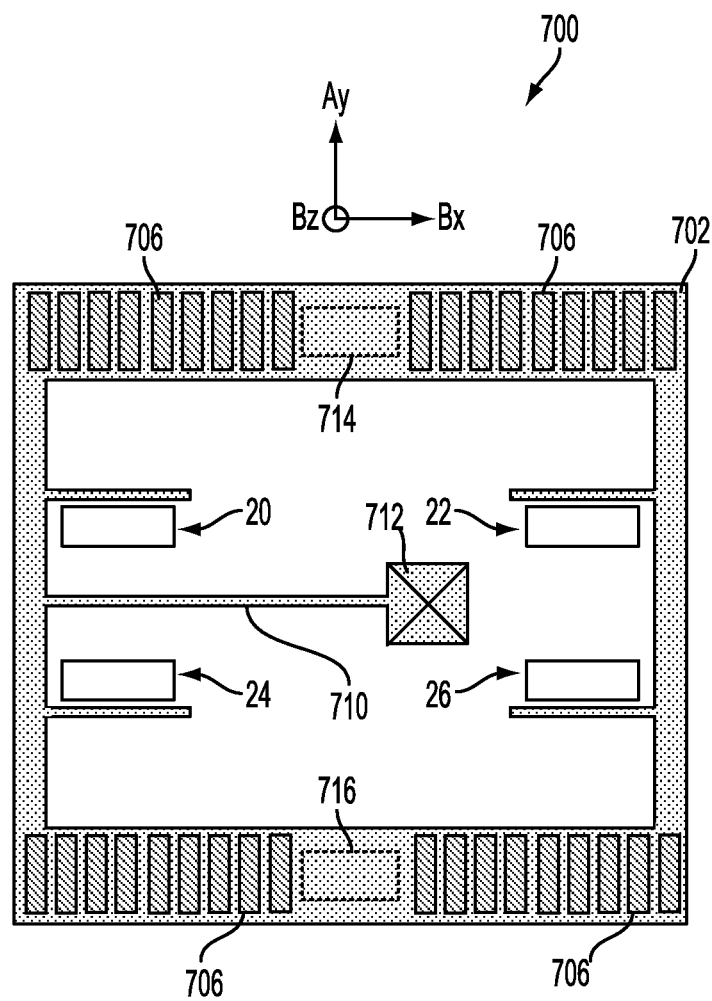
FIGS. 7-9 show MEMS devices, in accordance with various embodiments of the invention.

FIG. 7 shows a MEMS device 700, in accordance with another embodiment of the invention. The MEMS device 700 is a y-axis accelerometer and can also be used as an x-axis magnetometer and a z-axis magnetometer. The MEMS device 700 is shown to include the proof mass 702 with a magnetized magnetic material 706 disposed on a surface of two of its sides.

The MEMS device 700 is further shown to include a spring 710 and an anchor 712. The anchor 712 is connected to the substrate, which is under the structures shown in FIG. 7. The spring 710 is suspended from the anchor 712 and the proof mass 702 is suspended from the spring 710. The single spring shown can also be replaced with 2 or more springs. The magnetization of the magnetized magnetic materials 706 is along the positive y axis.

Under acceleration in the positive y direction, proof mass 702 experiences a force in the negative y direction causing a linear motion of the proof mass 702 in the negative y direction. For a negative y displacement, in the case where the sensing elements 20-26, 714, and 716 are capacitors, capacitors 20 and 22 increase in capacitance and capacitors 24 and 26 decrease in capacitance. To sense acceleration, the positive-going capacitors in a bridge configuration such as in FIG. 2(a) are capacitors 24 and 26, and the negative-going capacitors in the bridge are capacitors 20 and 22.

Under a positive x-axis magnetic field the proof mass 702 experiences a negative z-axis torque causing the proof mass 702 to rotate in-plane in a clockwise direction. For a clockwise rotation of the proof mass 702, the capacitors 20 and 26 decrease in capacitance and the capacitors 22 and 24 increase in capacitance such as the bridge in FIG. 2(b).

Under a positive z-axis magnetic field the proof mass 702 experiences a positive x-axis torque causing the proof mass 702 to rotate out-of-plane around axis 720 in a positive RX motion. This rotation causes the top of the proof mass 702 to move up and the bottom of the proof mass 702 to move down, causing the capacitor 714 to decrease and the capacitor 716 to increase.

In FIG. 7 if the magnetic material 706 is deposited on the top of the MEMS it creates an imbalance of the mass about the rotation center such that under an y-axis ambient acceleration proof mass 702 to rotates in the RY axis causing a false ambient z-axis magnetic signal. To remove this unwanted motion the signal processors combines the response of capacitors 20-26 from y-axis ambient acceleration with capacitors 714 and 716 to determine the response from ambient z-axis magnetic field.

Figure 8:
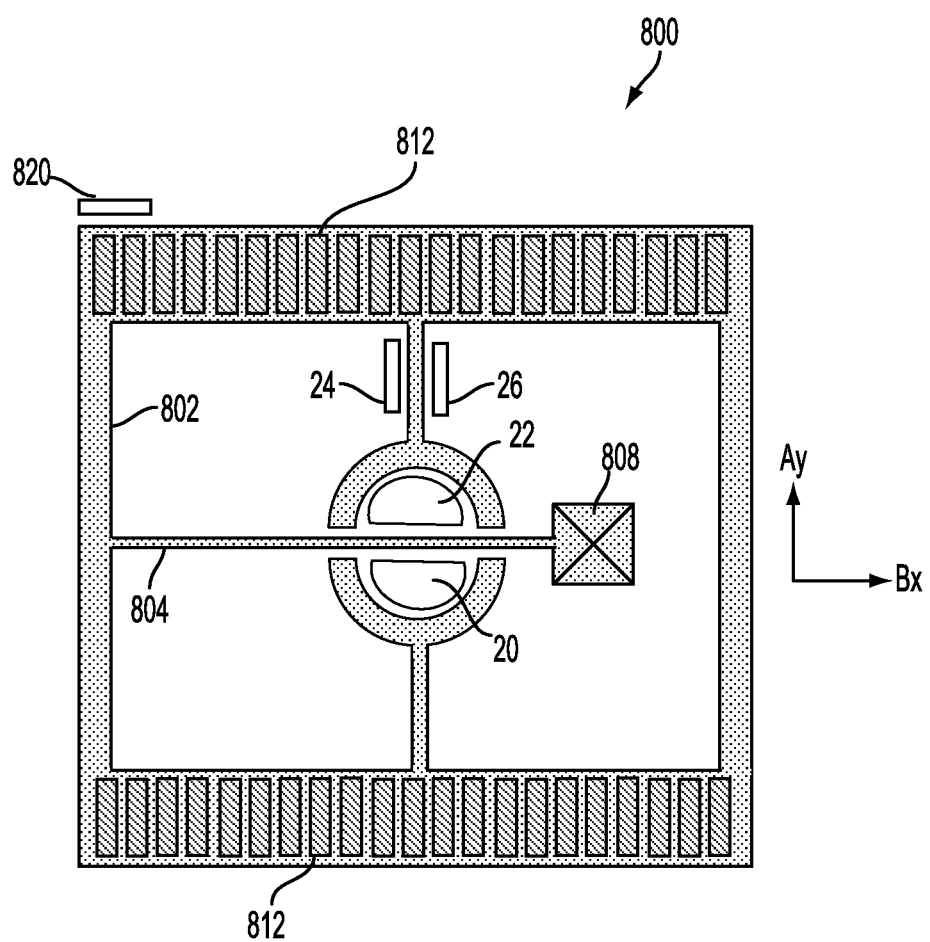

FIG. 8 shows a MEMS device 800, in accordance with another embodiment of the invention and is a y-axis accelerometer with a x-axis magnetometer. The MEMS device 800 is shown to include a proof mass 802, the magnetized magnetic materials 812, the anchor 808, spring 804 and sensing elements 20-26.

The magnetized magnetic material 812 is partially disposed over the proof mass 802. The anchor 808 is connected to the substrate and the spring 804 connects the proof mass 802 to anchor 808 suspending the proof mass from the substrate. The sensing elements 20 and 22 are positioned substantially in the middle of the proof mass 802, such that they are sensitivity to y-axis motion of proof mass 802 and nominally reject RZ motion and all other motions of proof mass 802. The sensing elements 24 and 26 are positioned such that they are sensitivity to RZ motion of proof mass 802 and nominally reject y-axis and all other motions of proof mass 802.

When the MEMS device 800 undergoes external y-axis acceleration the proof mass 802 experiences a negative y-axis force and moves in the negative y direction. The y-axis motion of proof mass 802 is detected with capacitors 20 and 22, while capacitors 24 and 26 nominally remain unchanged In the MEMS device 800, the magnetization of the magnetized magnetic materials 812 is along the positive y-axis. Under an external x-axis magnetic field the proof mas will experience a negative RZ torque causing proof mass 802 to rotate in-plane in a negative RZ direction (clockwise direction). The motion is detected with capacitors 24 and 26, while capacitors 20 and 22 nominally remain unchanged.

MEMS device 800, allows for simultaneous ambient magnetic field and ambient acceleration sensing increasing the data output rate. Here the sensing elements are driven and the output of the sensor is a single point connected to the proof mass 802 through the anchor 808. To differentiate the two signals at the single output the sensing elements are driven at different frequencies. The single output point is demodulated at two frequencies to separate the response from ambient acceleration and ambient magnetic field. Capacitors 20 and 22 are excited and demodulated at the single output point at frequency 1 to determine the ambient acceleration response and capacitors 24 and 26 are excited and demodulated at the single output point at frequency 2 to determine the response to ambient magnetic field.

In MEMS device 800 due to fabrication variations can cause the rotation center to be misaligned with the mass center. This imperfection will have the following imperfect effect. When MEMS device 800 undergoes ambient y-axis acceleration the proof mass 802 will experience a negative y-axis force and a RZ torque. Resulting in a y-axis translation and a RZ rotation. The motion will be detected with capacitors 20-26. When MEMS device 800 undergoes ambient x-axis magnetic field the proof mass 802 will experience a negative RZ torque and y axis force. Resulting in a negative RZ rotation and a y-axis motion. The motion will be detected with capacitors 20-26.

In MEMS device 800 the rotation center can be misaligned with the mass center either due to fabrication variations or intentionally designed. The method below describes how to experimentally determine this misalignment and use a signal processor to compensate for it. A signal processor uses the response from the capacitors 20-26 to extract the response from ambient acceleration and ambient magnetic field. The output of the sensor can be described by the following equation Differential capacitance change for an RZ motion of the proof mass ($\delta C_{RZ}$)

$$\delta C_{RZ} = C_{24} - C_{26}$$

Differential capacitance change for a y axis motion of the proof mass ($\delta C_y$)

$$\delta C_Y = C_{22} - C_{20}$$

To extract the response from ambient magnetic field ($M_{x\text{-}axis}$) and ambient acceleration ($A_{y\text{-}axis}$) the four quantities A, B, C and D are required from the below equation $$M_{x\text{-}axis} = A * \delta C_{RZ} + B * \delta C_Y$$

$$A_{y\text{-}axis} = C * \delta C_{RZ} + D * \delta C_Y$$

Figure 9:
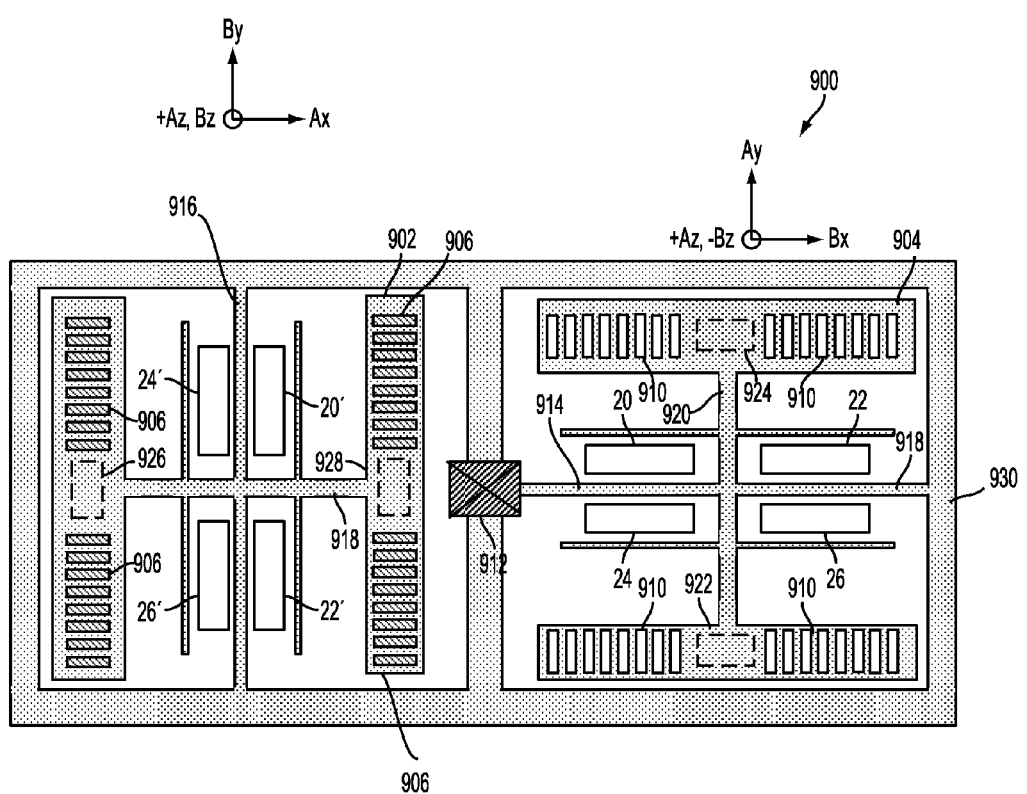

To extract the coefficients A, B, C and D the device is excited using an electrostatic or magnetic self test shown by 820. First the device is resonated with the self-test at the rotating RZ-axis modal frequency with a known magnitude. Quantity A can be determined by measuring the response of $\delta C_{RZ}$. Quantity B can be determined by measuring the response of $\delta C_Y$. Secondly the device is resonated with this self-test at the translating Y-axis modal frequency with a known magnitude. Quantity C can be determined by measuring the response of $\delta C_{RZ}$. Quantity D can be determined by measuring the response of $\delta C_Y$. Once quantities A, B, C and D are known the signal processor can combined capacitors 22-26 and output the response of ambient magnetic field and ambient acceleration FIG. 9 shows a MEMS device 900, in accordance with yet another embodiment of the invention. The MEMS device 900 is a single structure combination three-axis accelerometer and three-axis magnetometer. The MEMS device 900 is shown to include proof masses 902, and 904, anchor 912, magnetized magnetic material 906, and 910, sensing elements 20-26, 922, 924, 20'-26', 926, and 928, and springs 918 and 916.

The anchor 912 is rigidly connected to the substrate and is rigidly suspending the frame 930. The proof mass 902 is connected to the frame 930 by the spring 916. Proof mass 904 is connected to the frame 930 by the spring 918. The proof mass 902 is substantially 90 degrees rotated relative to the proof mass 904. Proof mass 904 has four in-plane sensing elements, 20-26, and has two out-of-plane sensing elements 922 and 924. Proof mass 902 has four in-plane sensing elements 20'-26' and has two out-of-plane sensing elements 926 and 928.

The magnetic material 906 is disposed partially on proof mass 902 and is magnetized along the x-axis. The magnetic material 910 is disposed partially on proof mass 904 and is magnetized along the y-axis.

The proof mass 904 is unbalance about the x-axis and is heavier on the positive y-axis so that external positive z-axis acceleration causes a negative RX rotation of proof mass 904. The proof mass 902 is unbalance about the y-axis and is heavier on the negative x-axis so that external positive z-axis acceleration causes a positive RY rotation of proof mass 902.

The detection of the six inputs is done by selecting the correct combination of sensing elements.

Under an external acceleration in the positive x direction, proof mass 902 moves in the negative x-axis and capacitances of the sensing elements 20' and 22' increase while capacitances of the sensing elements 24' and 26' decrease.

Under an external acceleration in the positive y direction, proof mass 904 moves in the negative y-axis capacitances of the sensing elements 20 and 22 increase while capacitances of the sensing elements 24 and 26 decrease.

Under an external acceleration in the positive z direction, proof mass 904 moves in a positive RX motion and proof mass 902 moves in a positive RX motion and the capacitances of the sensing elements 926 and 924 increase while capacitances of the sensing elements 922 and 928 decrease.

Under an external magnetic field in the positive x direction, proof mass 904 rotates in a negative RZ (clockwise) motion and the capacitances of the sensing elements 22 and 24 increase while capacitances of the sensing elements 20 and 26 decrease.

Under an external magnetic field in the positive y direction, proof mass 902 rotates in a positive RZ (anti-clockwise) motion and capacitances of the sensing elements 20' and 26' increase while capacitances of the sensing elements 22' and 24' decrease.

Under an external magnetic field in the positive z direction, proof mass 904 rotates in a positive RX motion and proof mass 902 rotates in a positive RY motion and capacitances of the sensing elements 922 and 926' increase while capacitances of the sensing elements 924 and 928 decrease.

Figure 10:
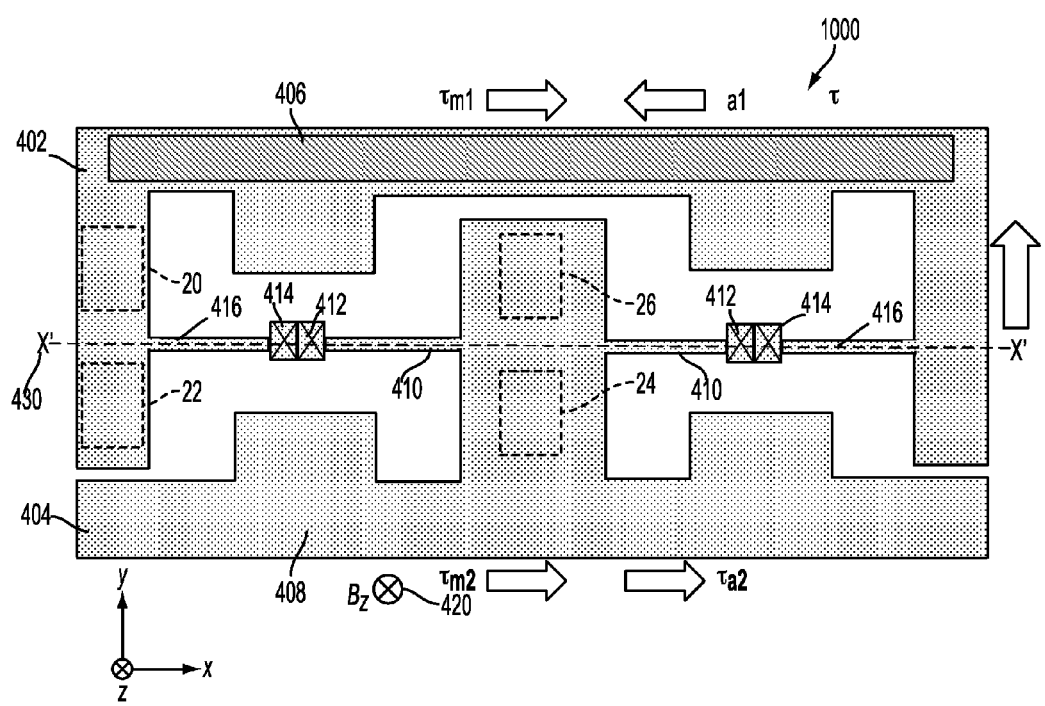
FIG. 10 shows MEMS devices, in accordance with various embodiments of the invention.

FIG. 10 shows a MEMS device 1000, in accordance with another embodiment of the invention. The MEMS device 1000 of FIG. 10 is analogous to the MEMS device 400 of FIG. 4 with the removal of magnetic material 408 from proof mass 404

MEMS device 1000 under a z-axis ambient acceleration response the same as MEMS device 400. MEMS device 1000 under ambient z-axis magnetic field behaves differently to MEMS device 400. Only proof mass 406 in MEMS device 1000 response to ambient magnetic field and proof mass 404 in MEMS device 1000 does not respond. The signal processor can determine the ambient z-axis acceleration response by combining the response of capacitors 24-26 or capacitors 22-26 and the ambient z-axis magnetic response is determined by combining the response of capacitors 20-26.

Although the description has been described with respect to particular embodiments thereof, these particular embodiments are merely illustrative, and not restrictive.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. A MEMS device comprising:
 a single proof mass that moves in a first direction, in response to an ambient acceleration along a first axis and rotates about a second direction in response to an ambient magnetic field along a second axis,
 a first magnetized magnetic material disposed partially on a surface of the single proof mass;
 a first spring anchored to a substrate to support the single proof mass;
 a first sensing element coupled to the single proof mass and responsive to the motion of the proof mass in the first direction and responsive to the rotation of the proof mass about the second direction,
 a second sensing element coupled to the single proof mass and responsive to the motion of the proof mass in the first direction, and responsive to the rotation of the single proof mass about the second direction; and
 a signal processor coupled to the first and second sensing elements and operable to generate a first output responsive to the ambient magnetic field along the second axis.

2. The MEMS device, as recited in claim 1, wherein the signal processor is operable to generate a second output responsive to the ambient acceleration along the first axis.

3. The MEMS device, as recited in claim 1, wherein the first sensing element is a first variable capacitor and the second sensing element is a second variable capacitor.

4. The MEMS device, as recited in claim 1, wherein the first sensing element and the second sensing element are differential variable capacitors.

5. The MEMS device, as recited in claim 1, further comprising a second spring and a second proof mass, wherein the second spring is anchored to the substrate to support the second proof mass.

6. The MEMS device, as recited in claim 5, wherein the first and second sensing elements are coupled to the second proof mass.

7. The MEMS device, as recited in claim 6, wherein the second proof mass moves a third direction in response to the ambient acceleration along the second axis and wherein the second proof mass moves in a fourth direction in response to the ambient magnetic field along the second axis.

8. The MEMS device, as recited in claim 6, wherein a magnetized magnetic material is deposited on the second proof masses such that the magnetized second proof mass responds to both the ambient acceleration along the first axis and the ambient magnetic field along the second axis.

9. The MEMS device, as recited in claim 1, wherein a center of rotation of the single proof mass is not aligned with a center of mass of the single proof mass.

10. The MEMS device, as recited in claim 1, wherein a center of rotation of the single proof mass is not aligned with a center of mass of the single proof mass due to manufacturing imperfection.

11. The MEMS device, as recited in claim 1, wherein the first sensing element and the second sensing element are responsive to an out-of-plane motion of the single proof mass.

12. The MEMS device, as recited in claim 1, wherein the first sensing element and the second sensing element are responsive to an in-plane motion of the single proof mass.

13. The MEMS device, as recited in claim 1, wherein the first sensing element is responsive to an out-of-plane motion of the single proof mass and the second sensing element is responsive to an in-plane motion of the single proof mass.

14. The MEMS device, as recited in claim 1, further including self-test coils configured to carry current to generate a magnetic field for testing the MEMS device.

15. The MEMS device, as recited in claim 1, wherein the first and second sensing elements are each pieizoresistor sensing elements.

16. MEMS device, as recited in claim 1, wherein the first and second, sensing elements are each piezoelectric sensing elements.

17. The MEMS device, as recited in claim 1, wherein the first and second sensing elements are each optical sensing elements.

18. The MEMS device, as recited in claim 1, wherein the first magnetized magnetic material comprises any combination of cobalt (Co), iron (Fe), and nickel (Ni).

19. The MEMS device, as recited in claim 1, wherein the first magnetized magnetic material is made of hard magnetic material.

20. The MEMS device, as recited in claim 1, wherein the first magnetized magnetic material comprises alternate layers of ferromagnetic material and anti-ferromagnetic material.

21. The MEMS device, as recited in claim 1, further comprising a self-test electrode configured to apply electrostatic force on the single proof mass.

22. The MEMS device, as recited in claim 1, wherein the first sensing element includes additional sensing elements, the additional sensing elements being operable to sense a motion of additional proof masses.

23. The MEMS device, as recited in claim 4, wherein the first and second differential sensing variable capacitors are connected in a Wheatstone bridge configuration.

24. The MEMS device, as recited in claim 2, further comprising a third sensing element, wherein the third sensing element is coupled to the single proof mass and is responsive to the motion of the proof mass in the third direction.

25. The MEMS device, as recited in claim 24, wherein the single proof mass moves along the third direction in response to acceleration along a third axis and the third sensing element is further coupled to the signal processor and operable to generate a third output responsive to acceleration along the third axis.

26. The MEMS device, as recited in claim 25, further including a second switch operable to allow changing of the signal processor based on sensing of the ambient acceleration along the third axis.

27. The MEMS device, as recited in claim 24, wherein the single proof mass moves along the third direction in response to the magnetic field along a third axis and coupled to the third sensing element along a second axis and is further coupled to the signal processor and operable to generate a third output responsive to the magnetic field along the third axis.

28. The MEMS device, as recited in claim 27, further including a second switch operable to allow changing of the signal processor based on sensing of the axis of ambient magnetic field along the third axis.

29. The MEMS device, as recited in claim 28, further including a second MEMS device positioned orthogonally relative to the MEMS device thereby allowing measurement of ambient acceleration along three axes of and allowing measurement of the ambient magnetic field along three axes.

30. The MEMS device, as recited in claim 29, wherein the second MEMS device is identical to the MEMS device.

31. The MEMS device of claim 2, further including a second proof mass that moves in response to both the ambient acceleration along a second direction and the ambient magnetic field along a second axis.

32. The MEMS device, as recited in claim 2, wherein the signal processor further includes a first switch operable to allow switching between sensing of the ambient acceleration along the first axis and sensing of the ambient magnetic field along the second axis.

33. The MEMS device of claim 31, further including a third and a fourth sensing elements coupled to the second proof mass and the signal processor, wherein the third and fourth sensing elements are responsive to both the ambient magnetic field along the second axis and the ambient acceleration along the second direction, further wherein the second proof mass moves in response to both the ambient acceleration along the second direction and the ambient magnetic field along the second axis, the signal processor being operable to generate a third output responsive to the ambient magnetic field along the second axis.

34. The MEMS device, as recited in claim 31, wherein the second sensing element includes additional sensing elements operable to sense a motion of any combination of the first proof mass, the second proof mass, and the additional proof masses.

35. A MEMS device comprising:
a single proof mass that moves in a first direction, in response to both an ambient acceleration along a first axis and rotates about a second direction in response to an ambient magnetic field along a second axis;
a first magnetized magnetic material disposed partially on a surface of the first proof mass;
a first spring anchored to a substrate to support the single proof mass;
a first sensing element coupled to the single proof mass and responsive to the motion of the proof mass in the first direction; and
a second sensing element coupled to the single proof mass and responsive to the rotation of the single proof mass about the second axis.

36. The MEMS device, as recited in claim 35, wherein the first and second sensing elements are mutually orthogonal.

37. The MEMS device, as recited in claim 35, further comprising a self-test electrode configured to apply electrostatic force on the first proof mass.

38. The MEMS device, as recited in claim 35, further comprising a signal processing circuit having a first demodulator operable to drive the first sensing element at a first drive frequency and a second demodulator operable to drive the second sensing element at a second drive frequency, the second drive frequency being substantially different than the first drive frequency,
wherein the ambient acceleration and the ambient magnetic field are sensed substantially simultaneously using frequency demodulation at the first and second drive frequencies.

39. The MEMS device, as recited in claim 35, wherein the first magnetized magnetic material comprises alternate layers of hard magnetic material and soft magnetic material.

40. A method of detecting magnetic field by a MEMS device comprising:
providing a first proof mass that moves in a first direction, in response to an ambient acceleration along a first axis and rotates about a second direction in response to an ambient magnetic field along a second axis;
providing a second proof mass that moves in a third direction, in response to an ambient acceleration along a first axis;
sensing a motion of the first proof mass;
sensing a motion of the second proof mass;
combining the sensed motion of the first and second proof masses to determine ambient magnetic field.

41. The method of claim 40, providing magnetized magnetic material on the second proof mass wherein the second proof mass further rotates about a fourth direction in response to an ambient magnetic field along a second axis.

42. The method of claim 40, wherein the combing step includes switching between sensing the first proof mass and the second proof mass to output a signal proportional to ambient acceleration or ambient magnetic field.

43. The method of claim 40, further comprising a method of detecting the coefficients of the signal processor for combining first and second sensed motions to output a signal proportional to ambient magnetic field comprising:
a first self-test resonating the first proof mass at its natural frequency with a known magnitude;
measuring the response motion of first proof mass;
a second self-test resonating the second proof mass at its natural frequency with a known magnitude;

measuring the response motion of the second proof mass; and using the measured motion from the first and second sensing elements from the first and second proof masses, determining the coefficients.

44. The method of claim 43, wherein a center of rotation of the second proof is not aligned with a center of mass of the second proof mass due to manufacturing imperfection.

45. A method of detecting magnetic field by a MEMS device comprising:

providing a proof mass that rotates about a first axis in response to a magnetic field and moves along a first direction in response to acceleration;

sensing the rotation of the proof mass along the first axis with sensing element one and sensing the motion along the first direction sensing element two; and using a signal processor to output a signal proportional to the magnetic field by combining the output of sensing element one and the output of the sensing element two.

46. The method of claim 45, further comprising detecting the coefficients of the signal processor for combining the first and second sensing elements to output a signal proportional to ambient magnetic field, wherein a self-test resonates the proof mass at the natural frequency with a known magnitude; sensing the motion using the first and second sensing elements; and using the measured response from the first and second sensing element determining the coefficients.

47. The method of claim 45, providing magnetized magnetic material on the second proof mass.

48. The method of claim 45, wherein sensing the motion further comprises:

generating a first signal at a first frequency, wherein the first signal is responsive to the motion of sensing element one;

generating a second signal at a second frequency, wherein the second signal is responsive to the motion of sensing element two.

49. The method of claim 45, wherein a center of rotation of the proof mass is not aligned with a center of mass of the second proof mass.

50. The method of claim 48, further comprising:

upon movement of a proof mass in response to the ambient magnetic field and ambient acceleration, wherein a third signal generating, by demodulating the first signal at the first frequency, a fourth signal by demodulating the second signal at the second frequency; and a signal processor combining the third and fourth signals to output a signal responsive to an ambient acceleration.

51. The method of claim 48, further comprising:

generating a third signal by demodulating the first signal at the first frequency and generating a fourth signal by demodulating the second signal at the second frequency; and combining the demodulated third and fourth signals; by a signal processor to output a signal responsive to the ambient magnetic field.

* * * * *